US012672277B2

(12) United States Patent
Wang et al.

(10) Patent No.: US 12,672,277 B2
(45) Date of Patent: Jun. 30, 2026

(54) SEMICONDUCTOR STRUCTURE HAVING A LADDER CONTACT STRUCTURE

(71) Applicant: ChangXin Memory Technologies, Inc., Hefei City (CN)

(72) Inventors: Hong Wang, Hefei City (CN); Xiaojie Li, Hefei City (CN)

(73) Assignee: CHANGXIN MEMORY TEHNOLOGIES, INC., Hefei City (CN)

( * ) Notice: Subject to any disclaimer, the term of this patent is extended or adjusted under 35 U.S.C. 154(b) by 381 days.

(21) Appl. No.: 18/547,320

(22) PCT Filed: Apr. 7, 2023

(86) PCT No.: PCT/CN2023/087059
§ 371 (c)(1),
(2) Date: Aug. 21, 2023

(87) PCT Pub. No.: WO2024/036991
PCT Pub. Date: Feb. 22, 2024

(65) Prior Publication Data
US 2025/0040128 A1 Jan. 30, 2025

(30) Foreign Application Priority Data
Aug. 15, 2022 (CN) .......................... 202210977417.8

(51) Int. Cl.
*H10B 12/00* (2023.01)
*H10W 20/00* (2026.01)

(52) U.S. Cl.
CPC ......... *H10B 12/485* (2023.02); *H10B 12/482* (2023.02); *H10B 12/488* (2023.02); *H10W 20/064* (2026.01)

(58) Field of Classification Search
CPC .... H10B 12/00; H10B 12/482; H10B 12/485; H10B 12/488; H10W 20/064
See application file for complete search history.

(56) References Cited

U.S. PATENT DOCUMENTS

| | | |
|---|---|---|
| 11,152,391 B2 | 10/2021 | Iguchi et al. |
| 2011/0244666 A1 | 10/2011 | Kim et al. |
| 2012/0052674 A1 | 3/2012 | Lee et al. |

(Continued)

FOREIGN PATENT DOCUMENTS

CN          102468282 A          5/2012

OTHER PUBLICATIONS

PCT/CN2023/087059 International Search Report and Written Opinion mailed Jun. 23, 2023.

*Primary Examiner* — Hoai V Pham
(74) *Attorney, Agent, or Firm* — Syncoda LLC; Feng Ma

(57) ABSTRACT

The present disclosure discloses a semiconductor structure and a method for fabricating the semiconductor structure. The semiconductor structure includes a plurality of word lines and a plurality of bit lines; ladder structure, including multiple steps, each step includes a first part which extends along the first direction, and a second part which extends along the second direction; a plurality of electrical contact structures, the electrical contact structures is disposed on the top surfaces of a portion of the first part and the second part of the steps, and the electrical contact structures are electrically connected to the word lines or bit lines.

10 Claims, 26 Drawing Sheets

(56) References Cited

U.S. PATENT DOCUMENTS

| 2017/0062337 | A1  | 3/2017 | Park et al. |            |
| 2017/0256558 | A1* | 9/2017 | Zhang       | H10B 43/35 |
| 2021/0202488 | A1* | 7/2021 | Choi        | H10B 12/30 |

* cited by examiner

SEMICONDUCTOR STRUCTURE HAVING A LADDER CONTACT STRUCTURE

CROSS REFERENCES TO RELATED APPLICATIONS

This application claims the benefit of priority of Chinese patent application submitted on Aug. 15, 2022, entitled "A SEMICONDUCTOR STRUCTURE AND ITS FABRICATION METHOD", with the application number 202210977417.8, the contents of which are incorporated herein by reference in its entirety.

TECHNICAL FIELD

The present disclosure relates to the field of semiconductor technology, in particular to a semiconductor structure and a method to fabricate the semiconductor structure.

BACKGROUND

As the integration level of the dynamic memory develops toward higher density, more stringent requirements are imposed on the arrangement of transistors in the dynamic memory array structure.

In order to further improve the integration level of semiconductor structures, three-dimensional semiconductor structures are being studied. The three-dimensional semiconductor structure refers to a three-dimensional stacked semiconductor structure, that is, transistors in the semiconductor structure are arranged in a stacked arrangement. The three-dimensional stacked semiconductor structure has the characteristics of high density, large capacity and high speed.

However, for a three-dimensional semiconductor structure, how to design the connection mode of each functional device to reduce the difficulty of wire arrangement in the semiconductor structure is an urgent problem to be solved at the present time.

SUMMARY

Embodiments of the present disclosure provide a semiconductor structure and a method for preparing the semiconductor structure, which at least help reduce the difficulty of arranging leads in the semiconductor structure.

An embodiment of the present disclosure provides a semiconductor structure, comprising: a plurality of word lines and a plurality of bit lines, the extending direction of the word lines is different from the extending direction of the bit lines; a ladder structure, the ladder structure includes multi-level steps, the steps at least include a first part and a second part connected, the first part extends along a first direction, the second part extends along a second direction, the first direction and the second directions are different; a plurality of electrical contact structures, the electrical contact structures cover part of the top surfaces of the steps of the first part and the second part, and the electrical contact structures are in contact with the word line or the bit line.

Correspondingly, an embodiment of the present disclosure also provides a method for preparing a semiconductor structure, comprising: forming a plurality of word lines and a plurality of bit lines, wherein the extending direction of the word lines is different from the extending direction of the bit lines; a ladder structure is formed, the ladder structure includes multiple steps, the steps at least include a first part and a second part connected, the first part extends along a first direction, and the second part extends along a second direction, so the first direction is different from the second direction; a plurality of electrical contact structures are formed, and the electrical contact structures cover part of the step top surfaces of the first part and the second part, and the electrical contact structures are in contact with the word line or bitline contacts. It should be understood that the above general description and the following detailed description are only exemplary and cannot limit the present disclosure.

BRIEF DESCRIPTION OF THE DRAWINGS

One or more embodiments are exemplified by the pictures in the accompanying drawings corresponding thereto, and these exemplifications do not constitute a limitation to the embodiments, and unless otherwise stated, the figures in the accompanying drawings do not constitute a restriction to scale. In order to more clearly illustrate the technical solutions in the embodiment of the present disclosure or the traditional technology, the following will briefly introduce the accompanying drawings that need to be used in the embodiment. Obviously, the accompanying drawings in the following description are only the disclosure of the present disclosure For some embodiments, those skilled in the art can also obtain other drawings based on these drawings without creative effort.

DETAILED DESCRIPTION OF THE PREFERRED EMBODIMENTS

To reduce the difficulty of wiring arrangement in the semiconductor structure is an urgent problem to be solved at present.

An embodiment of the present disclosure provides a semiconductor structure. In the ladder structure, each step at least includes a first part and a second part that are connected, the first part extends toward the first direction, and the second part extends toward the second direction, and the first direction is different from the second direction. In this way, the electrical contact structures disposed on the top surfaces of the steps of the first part and the second part also extend in two different directions, which is equivalent to forming two sets of steps in different directions in a ladder structure. The word line or the bit line is in contact with the ladder structure in the direction to realize the signal transmission between the external circuit and the word line or the bit line. That is to say, the way of arranging the leads is increased, and the difficulty of arranging the leads is reduced. In addition, since the lead wires can be arranged in different directions to lead out the electrical contact structure, the distance between the lead wires is relatively large, thereby reducing parasitic capacitance.

Various embodiments of the present disclosure will be described in detail below in conjunction with the accompanying drawings. However, those skilled in the art can understand that in various embodiments of the present disclosure, many technical details are provided for readers to better understand the present disclosure. However, even without these technical details and various changes and modifications based on the following embodiments, the technical solutions claimed in the present disclosure can be realized.

Figure 1:
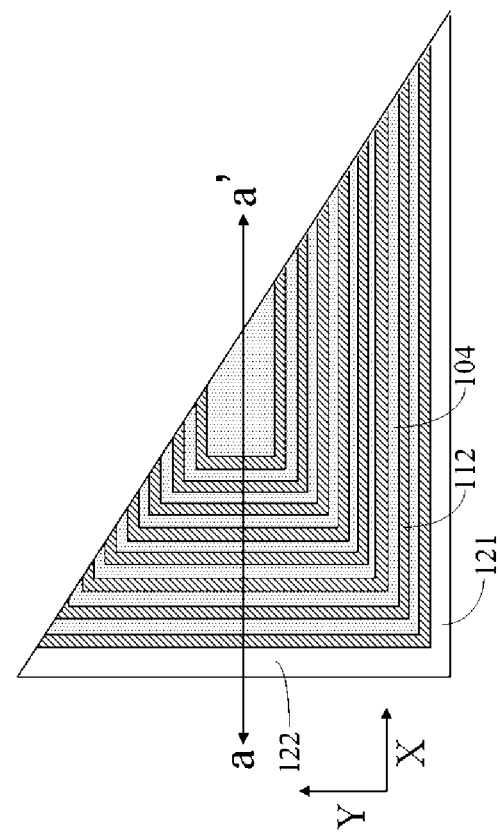
FIG. 1 is a schematic top view of a partial semiconductor structure provided by an embodiment of the present disclosure.
Figure 2:
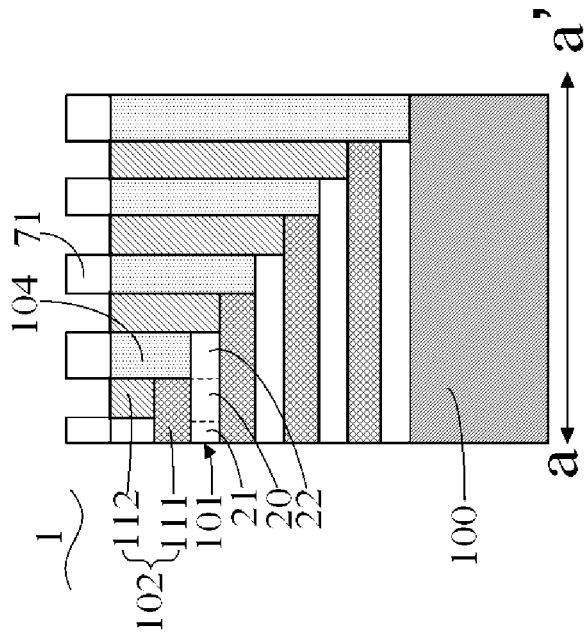
FIG. 2 is a cross sectional structure along the line aa' in FIG. 1.
Figure 3:
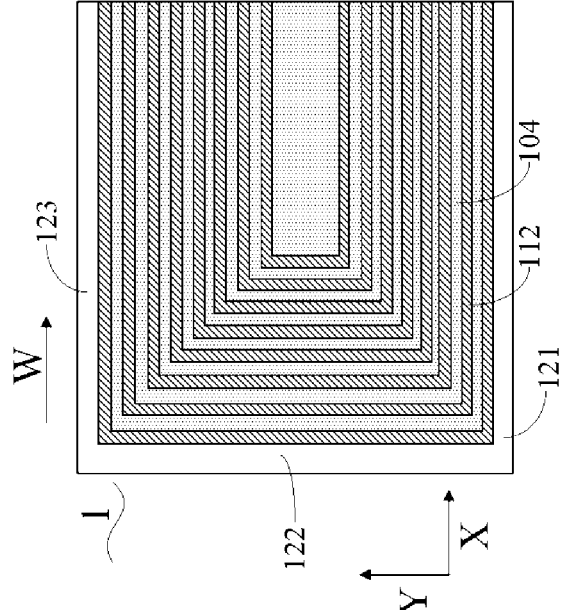
FIG. 3 is a schematic top view of another partial semiconductor structure provided by an embodiment of the present disclosure.
Figure 4:
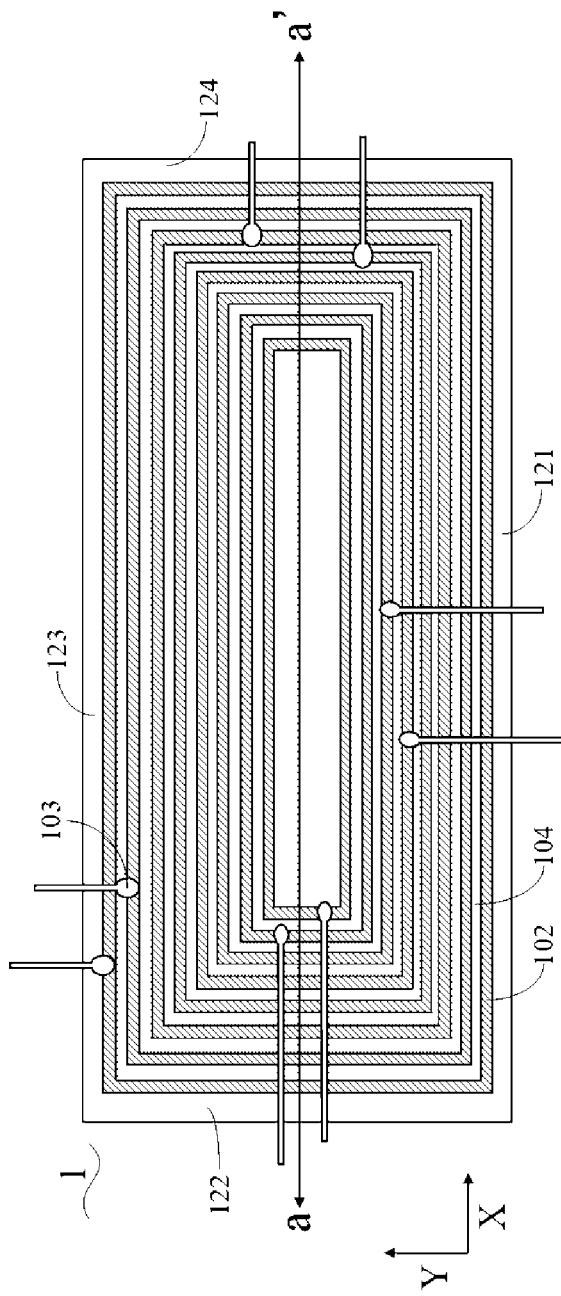
FIG. 4 is a schematic top view of another semiconductor structure provided by an embodiment of the present disclosure.

FIG. 1 is a schematic top view of a partial semiconductor structure provided by an embodiment of the present disclosure; FIG. 2 is a cross sectional structure along the line aa' in FIG. 1; FIG. 3 is a schematic top view of another partial semiconductor structure provided by an embodiment of the present disclosure; FIG. 4 is a schematic top view of another semiconductor structure provided by an embodiment of the present disclosure.

In FIGS. 1 to 4, the semiconductor structure includes: a plurality of word lines and a plurality of bit lines, the extension direction of the word line is different from the extension direction of the bit line; a ladder structure 1, the ladder structure 1 includes multi-level steps 101, the step 101 includes at least a first part 121 and a second part 122 connected to each other. The first part 121 extends along a first direction X, and the second part 122 extends along a second direction Y. The first direction X is different from the second direction Y; multiple electrical contact structure 102, the electrical contact structure 102 covers part of the top surfaces of the steps 101 of the first part 121 and the second part 122, and the electrical contact structure 102 is in contact with the word line or the bit line.

Since the steps 101 extend in different directions, when the electrical contact structure 102 is located on the top surface of the step 101 of the first part 121 and the second part 122, the electrical contact structure 102 also faces the first direction X or the second direction Y extends, so that the electrical contact structure 102 also extends in two different directions, which is equivalent to forming at least two sets of steps in the ladder structure 1, so that the word line or bit line can be in the first direction X or the second direction Y, to form contact with the electrical contact structure 102 to realize signal transmission with external circuits. That is to say, by setting the steps 101 to extend in different directions, the electrical contact structure 102 can be led out in different directions, thereby increasing the ways of leading out the leads and reducing the difficulty of arranging the leads.

The step 101 can be used as the bearing structure of the electrical contact structure 102, and the step 101 of the previous level is located on a part of the top surface of the step 101 of the current level, specifically, the multi-level steps 101 are stacked up and down. Specifically, take the top step 101 as the first step 101, take the bottom step 101 as the Nth step 101, where N is greater than 1, and the n-th step 101 overlaps part of the n+1th step 101, $1 \leq n \leq N$.

In some embodiments, assuming that the step 101 includes the middle region 20 and the first side region 21 and the second side region 22 located on both sides of the middle region 20, the n-th step 101 covers the n+1st level top surface of the first side region 21 of the step 101 and the top surface of the middle region 20 expose the top surface of the second side region 22 of the n+1 step 101, and the first side region 21 in each step 101 is far away from the end faces of the central region 20 are flush. Since the top surface of the second side region 22 of each step 101 is not covered by another step 101, when the electrical contact structure 102 is located on the top surface of the step 101 of the first part and the second part, each electrical contact structure 102 on the top surface of the second side region 22 of the first step 101 is led out, so that each contact structure will not contact each other, preventing the problem of electrical interference.

In some embodiments, the material of the step 101 may include a dielectric material, such as silicon oxide.

In some embodiments, the electrical contact structure 102 includes: a contact layer 111, the contact layer 111 covers part of the top surface of the step 101; a connecting column 112, the connecting column 112 is in contact with the contact layer 111, wherein a plurality of steps 101 correspond to the top surfaces of the connection columns 112 are flush, and the ladder structure 1 exposes the end surface of the contact layer 111 away from the connection columns 112, and the exposed end surface is in contact with one of the bit line or the word line. In some embodiments, the connection column 112 may be arranged perpendicular to the contact layer 111; it can be an acute angle or passivation, that is, the connection column 112 is arranged obliquely compared with the contact layer 111. It can be understood that the positional relationship between the connection column 112 and the contact layer can be selected according to the actual manufacturing process. Specifically, in some embodiments, the material of the contact layer 111 and the connecting column 112 may be metal, such as at least one of tantalum, tungsten, titanium, copper, aluminum, silver, and gold; in other embodiments the material of the contact layer 111 may also be at least one of polysilicon or doped silicon, doped germanium, titanium nitride, tantalum nitride, tungsten silicide, cobalt silicide or titanium silicide.

Specifically, the contact layer 111 covers the top surface of the step 101 of the first side region 21, the middle region 20 and part of the second side region 22, and the contact layer 111 exposes the second side region 22 away from the middle region 20 Part of the top surface of the steps 101. Since the top surface of the step 101 of the second side region 22 is not covered by the upper step 101, the contact layer 111 is arranged on the top surface of the step 101 of a part of the second side region 22, which is easy to connect the pillar 112 and the contact layer 111. The top surface is contacted to lead out the signal of the contact layer 111.

The ladder structure 1 exposes the end surface of the contact layer 111 away from the connecting column 112. Specifically, the ladder structure 1 exposes an end surface of the contact layer 111 located in the first side region 21, exposing the contact layer 111 and the word line or bit line contacts. In other words, one end of the contact layer 111 is in contact with the word line or the bit line, so that the contact layer 111 is electrically connected to the word line or the bit line, and the other end of the contact layer 111 is in contact with the connection column 112, and the contact layer 111 is connected to the contact layer 111 through the connection column 112. The electrical signal is drawn out, so as to realize the signal transmission between the word line or bit line and the external circuit.

The electrical contact structure 102 is arranged on the top surface of each step 101, therefore, the contact layer 111 is located on the top surface of each step 101, and each contact layer 111 is in contact with a connecting column 112, that is, each step 101 corresponds to a connecting column 112. The connection column 112 is arranged perpendicular to the contact layer 111, that is, the connection column 112 is perpendicular to the top surface of the step 101, and the contact layer 111 is parallel to the top surface of the step 101, so that the electrical contact structure 102 connects the electrical signal of the word line or the bit line in the horizontal direction. Leading out, in the vertical direction, leads the electrical signal of the contact layer 111 to an external circuit. Setting the top surface of each connecting post 112 to be flush is beneficial to preparing a plurality of lead wires in batches, so that the lead wires are in contact with the connecting post 112 and lead out the electrical signal of the connecting post 112. In addition, because the top surfaces of each connecting column 112 are flush, it is also beneficial to reduce the difficulty of arranging the leads.

It can be understood that the contact layer 111 is located at the top surface of the step 101 of the first part and the second part, and the connecting column 112 is correspondingly arranged with the contact layer 111, that is, the connecting column 112 is located at the top surface of the step 101 of the first part and the second part.

In some embodiments, it also includes: a plurality of lead-out structures 103, and the lead-out structures 103 are electrically connected to the top surface of the connecting column 112. Specifically, the lead-out structure 103 is in contact with the top surface of the connecting pillar 112, so as to realize the electrical connection between the lead-out structure 103 and the connecting pillar 112. Specifically, in some embodiments, the electrical contact structure 102 is in contact with the word line, for example, the contact layer 111 on the top surface of the first partial step 101 is in contact with the word line, because the contact layer 111 on the top surface of the first partial step 101 is in contact with the second part of the contact layer 111 on the top surface of the step 101 is in contact. Therefore, the connection column 112 corresponding to the step 101 of the first part can be provided to connect with the lead-out structure 103, or the connection column 112 corresponding to the step 101 of the second part can be provided. It is connected with the lead-out structure 103, so as to realize the lead-out of the electric signal of the word line. It can be seen that the lead-out structure 103 can be arranged to be connected to the connecting column 112 in different directions. In the case of realizing the signal transmission between the word line or the bit line and the external circuit, the flexibility of setting the lead-out structure 103 is greatly improved, thereby reducing the lead-out structure. Difficulty in arranging the structure 103. Moreover, since the lead-out structures 103 can be arranged from different directions, the distance between the lead-out structures 103 is relatively large, thereby reducing parasitic capacitance.

In some embodiments, the angle between the first direction X and the second direction Y may be 90°, or close to 90°, such as 80°, 85°, 95° or 100°. In this way, on the one hand, the angle between the first direction X and the second direction Y is not too small, so that when the design of the lead-out structure 103 leads the electrical contact structure 102 from the first direction X or the second direction Y, due to the second angle between one direction X and the second direction Y is larger, so that the distance between the electrical contact structure 102 of the first part and the electrical contact structure 102 of the second part is larger, thus the distance between the lead-out structure 103 corresponding to the first part and the lead-out structures 103 corresponding to the second part is relatively larger, thereby reducing parasitic capacitance. On the other hand, this keeps the angle between the first direction X and the second direction Y not too large, preventing the problem that the overall size of the ladder structure 1 is too large due to the excessive distance between the first part and the second part, thereby making the overall size of the ladder structure 1 smaller.

It can be understood that, in some other embodiments, the angle between the first direction X and the second direction Y may also be less than 90° or greater than 90°.

In some embodiments, it further includes: an isolation structure 104, the isolation structure 104 is located between the adjacent electrical contact structures 102, and is used to isolate the adjacent electrical contact structures 102. Specifically, in some embodiments, the electrical contact structure 102 includes a contact layer 111 and a connecting column 112, and the contact layer 111 is located on the top surface of each step 101, so that each step 101 functions to isolate the contact layer 111. In order to isolate the adjacent connection columns 112, the isolation structure 104 may be located between the adjacent connection columns 112 to prevent electrical interference between the adjacent connection columns 112. In some embodiments, the material of the isolation structure 104 may be a dielectric material, such as silicon oxide.

In some embodiments, the electrical contact structure 102 exposes the top surface of the end of the step 101, and the isolation structure 104 is located on the top surface of the step 101 where the top surface is exposed. That is to say, the step 101 also acts as a bearing for the isolation structure 104, and the isolation structure 104 is located on one side of the electrical contact structure 102, so that the isolation structure 104 can better isolate the electrical contact structure 102. Specifically, in some embodiments, the contact layer 111 exposes part of the top surface of the step 101 of the second side region 22, the isolation structure 104 is located on the top surface of the step 101 of the part of the second side region 22, and one side of the isolation structure 104 It is in contact with the end surface of the contact layer 111, and the other side of the isolation structure 104 is flush with the end surface of the step 101. Since the connection post 112 is located on the top surface of the contact layer 111 corresponding to the step 101 of the remaining first side region 21, and one side of the connection post 112 is flush with the end surface of the step 101, the other side of the connection post 112 is flush with the contact layer 111 ends. Therefore, one side of the isolation structure 104 is set to be in contact with the end surface of the contact layer 111, and the other side of the isolation structure 104 is flush with the end surface of the step 101, so that the isolation structure 104 can be connected to the side surface of the connecting column 112 on the top surface of the contact layer 111. Closely combined, so that the isolation structure 104 has a better isolation effect on the connecting columns 112 on both sides.

In some embodiments, at least part of the step 101 further includes: a third part 123 connected to the second part 122, the third part 123 extends along a third direction W, and the third direction W is different from the second direction Y, and the electrical contact structure 102 also covers part of the top surface of the step 101 of the third part 123. That is to say, the step 101 of the third part 123 and the electrical contact structure 102 on the top surface of the step 101 of the third part 123 can also be used as a set of steps, so that the lead-out structure 103 can connect the electrical contact structure in three different orientations. Specifically, in some embodiments, when the electrical contact structure 102 of the first part 121 is in contact with the word line, that is, the contact layer 111 of the first part 121 is in contact with the word line, part of the lead-out structure 103 can be connected with the connection column 112 of the first part 121, so that the word line signal is drawn out in the first direction X, part of the lead-out structure 103 can also be connected with the electrical contact structure 102 of the second part 122, so that the word line signal is drawn out in the second direction Y, and the remaining part of the lead-out structure 103 can also be connected with the electrical contact structure 102 of the third part 123 so as to lead out the word line signal in the third direction W, which further improves the placement flexibility of the lead out structure 103. It can be understood that no matter which electrical contact structure 102 the lead-out structure 103 is connected to in the first part 121, the second part 122 or the third part 123, each lead-out structure 103 corresponds to a step 101, that is, each lead-out structure 103 corresponds to a step 101. An extraction structure 103 is connected to the electrical contact structure 102 on the top surface of a step 101, so as to extract the electrical signal of the word line corresponding to each step 101.

It can be understood that, in some other embodiments, the electrical contact structure 102 of the second part may also be set to be in contact with the word line or the bit line, or the electrical contact structure 102 of the third part may be set to be in contact with the word line or the bit line. line contact.

In some embodiments, the third direction is parallel to the first direction X. The third direction is set to be parallel to the first direction X, so that the relative distances between the third part and the first part are equal at each place, so that the distance between the third part and the first part is relatively large, thereby preventing the problem of large parasitic capacitance due to the distance between the lead-out structure 103 corresponding to the third part and the lead-out structure 103 corresponding to the first part being too small, and it can also prevent staggering and crossing of the lead-out structure 103 of the third part and the lead-out structure 103 of the first part, thus reducing the difficulty of arranging the lead-out structure 103. On the other hand, setting the third direction parallel to the first direction X will not keep the distance between the third part and the first part large, so that the overall size of the ladder structure 1 can be maintained small.

It is worth noting that, in some embodiments, part of the steps 101 may be set to include the third part, and the rest of the steps 101 only include the first part and the second part.

Referring to FIG. 3, in some other embodiments, it is also possible to set the steps 101 to include a third part, and the first part, the second part and the third part are sequentially connected to form a U-shaped step 101. In this way, the signal of the electrical contact structure 102 corresponding to the step 101 can be extracted in three different directions, that is, any one of the first part, the second part or the third part of the lead-out structure 103 and the step 101 can be set.

The corresponding electrical contact structures 102 are connected to further increase the arrangement of the lead-out structures 103. Specifically, in some embodiments, it may be set that each step 101 includes a third part.

Referring to FIG. 4, in some embodiments, the steps 101 form a closed ring. In this way, the lead-out structure 103 can be arranged to be connected with the electrical contact structure 102 in various directions, which greatly improves the arrangement flexibility of the lead-out structure 103, and greatly reduces the difficulty in arranging the lead-out structure 103.

In some embodiments, the closed ring is a closed rectangle, and the step 101 includes: a first part 121, a second part 122, a third part 123 and a fourth part 124 connected in sequence, and the third part 123 is along the first direction X extends, the fourth part 124 extends along the second direction Y, and the electrical contact structure 102 is also located on the top surface of the step 101 corresponding to the third part 123 and the fourth part 124. That is to say, a ladder structure 1 is equivalent to including four sets of ladders. When the electrical contact structure 102 is connected to any one of the word line or the bit line, the lead-out structure 103 can be set to be connected to the first part, the second part, the second part, and the second part respectively. Any one of the electrical contact structures 102 corresponding to the three parts or the fourth part is connected. The lead-out structures 103 can be fully utilized to design the lead-out structures 103, and while preventing electrical interference between different lead-out structures 103, the difficulty of arranging the lead-out structures 103 is greatly reduced. Moreover, since the lead-out structures 103 are located in different orientations, the distance between the lead-out structures 103 is greatly increased, thereby greatly improving the problem of large parasitic capacitance due to the dense arrangement of the lead-out structures 103.

Figure 6:
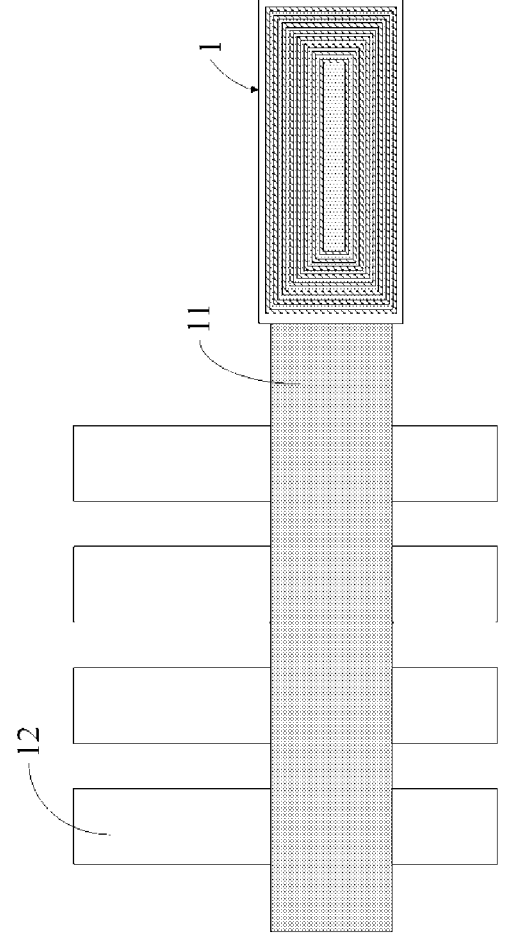
FIG. 6 is a schematic top view of a semiconductor structure provided by an embodiment of the present disclosure.
Figure 7:
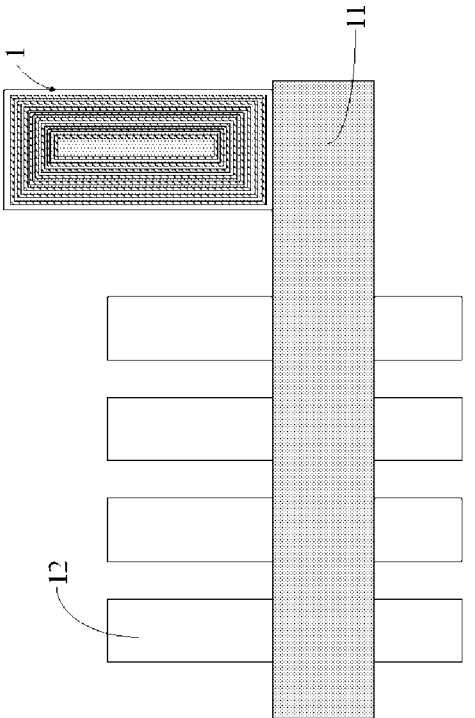
FIG. 7 is a schematic top view of another semiconductor structure provided by an embodiment of the present disclosure.
Figure 8:
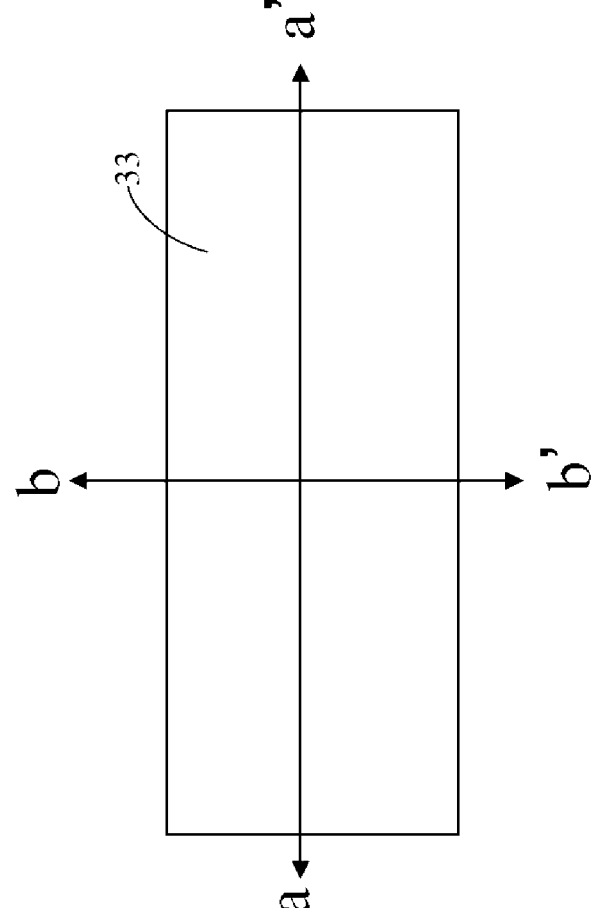
FIGS. 8 to 23 are structural schematic diagrams corresponding to each step in the method for preparing a semiconductor structure provided by another embodiment of the present disclosure.
Figure 9:
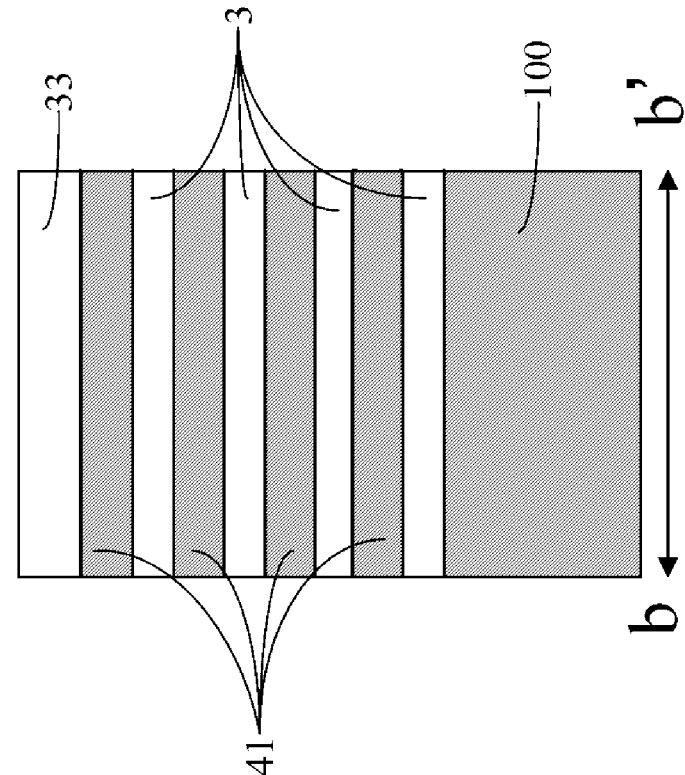

Referring to FIG. 6 and FIG. 7, in some embodiments, the bit line 12 or the word line 11 is electrically connected to any one of the electrical contact structures 102 corresponding to the first part or the second part. In some embodiments, a plurality of word lines 11 are arranged at intervals along the same direction, and a plurality of bit lines 12 are arranged at intervals along the same direction, and the bit lines 12 are perpendicular to the extending direction of the word lines 11. Specifically, in some embodiments, the semiconductor structure may further include semiconductor pillars arranged in an array, and the semiconductor pillars include a channel region and source and drain regions located on both sides of the channel region. The word line 11 may be electrically connected to each channel region in a row of semiconductor pillars, and the bit line 12 may be electrically connected to a source-drain region in a column of semiconductor pillars. In some embodiments, a gate dielectric layer may also be included, and the gate dielectric layer is located between the word line 11 and the semiconductor pillar of the channel region, and is used to isolate the word line 11 and the channel region. Wherein, the material of the word line 11 and the bit line 12 can be metal, such as at least one of tantalum, tungsten, titanium, copper, aluminum, silver, gold; it can also be polysilicon or doped silicon, doped germanium, At least one of titanium nitride, tantalum nitride, tungsten silicide, cobalt silicide, or titanium silicide. The material of the gate dielectric layer may be silicon oxide.

In the ladder structure 1, the multi-level steps 101 are stacked towards the same direction, therefore, the electrical contact structures 102 located on the top surface of the steps 101 are also stacked towards the same direction. Based on this, each electrical contact structure 102 can be connected to the word lines 11 arranged in the same direction in a one-to-one correspondence, or connected to the bit lines 12 arranged in the same direction in a one-to-one correspondence.

Since the electrical contact structure 102 is located on the top surface of the step 101 of the first part and the second part, any one of the electrical contact structure 102 corresponding to the step 101 of the first part or the second part can be set with the word line 11 or bit Line 12 is connected. In this way, the placement position of the ladder structure 1 can be set based on the specific structure of the word line 11 or the bit line 12. For example, refer to FIG. 6 and FIG. 7. In FIG. 6 and FIG. 7, the electrical connection between the ladder structure 1 and the word line is taken as an example, the ladder structure 1 can flexibly set the connection mode between the ladder structure 1 and the word line based on the placement position of the word line in the semiconductor structure. For example, referring to FIG. 6, the ladder structure 1 can be electrically connected to the end of the word line 11; referring to FIG. the location is relatively flexible, so that the space in the semiconductor structure can be fully utilized, and the space utilization rate can be improved, thereby improving the integration degree of the semiconductor structure.

It can be understood that, in some embodiments, when the step 101 further includes: a third part, the bit line 12 or the word line 11 can be connected to any one of the first part, the second part or the third part.

In other embodiments, when the step 101 further includes: a fourth part, the bit line 12 or the word line 11 may also be connected to the fourth part. In this way, the arrangement of the ladder structure 1 is further increased.

In the semiconductor structure provided by the above-mentioned embodiments, the set step 101 includes a first part and a second part, and the extension directions of the first part and the second part are different. Therefore, when the electrical contact structure 102 is located between the first part and the second part. When the step 101 is on the top surface, the electrical contact structure 102 also extends toward the first direction X or the second direction Y, so that the electrical contact structure 102 also extends toward two different directions, which is equivalent to forming at least two A set of steps enables the word line 11 or the bit line 12 to contact the electrical contact structure 102 in the first direction X or the second direction Y, so as to realize signal transmission with an external circuit. That is to say, by setting the steps 101 to extend in different directions, the electrical contact structure 102 can be led out in different directions, thereby increasing the ways of leading out the leads and reducing the difficulty of arranging the leads.

Correspondingly, the embodiment of the present disclosure also provides a kind of preparation method of semiconductor structure, the preparation method of this semiconductor structure can be used for preparing the semiconductor structure that above-mentioned embodiment provides, the semiconductor structure provided by an embodiment of the present disclosure will be described below in conjunction with accompanying drawings the structure is described in detail.

The preparation method of semiconductor structure comprises:

A plurality of word lines and a plurality of bit lines are formed, and the extending direction of the word lines is different from that of the bit lines. In some embodiments, a plurality of word lines are arranged at intervals along the same direction, a plurality of bit lines are arranged at intervals along the same direction, and the bit lines are perpendicular to the extending direction of the word lines.

Specifically, in some embodiments, it may further include: forming semiconductor pillars arranged in an array, and the semiconductor pillars include a channel region and source and drain regions located on both sides of the channel region. The word line is electrically connected to each channel region in a row of semiconductor pillars, and the bit line is electrically connected to a source and drain region in a column of semiconductor pillars.

In some embodiments, the method for forming a word line may include: using a deposition process to form a gate dielectric layer on the surface of the semiconductor column in the channel region, the material of the gate dielectric layer may be silicon oxide; using a deposition process to form a gate dielectric layer, the word line is formed on the surface, and the material of the word line can be metal, such as at least one of tantalum, tungsten, titanium, tantalum, copper, aluminum, silver, gold, or polysilicon or doped silicon, doped germanium, At least one of titanium nitride, tantalum nitride, tungsten silicide, cobalt silicide, or titanium silicide.

In some embodiments, the method for forming a bit line may include: using a deposition process to form a bit line on the end surface of one of the source and drain regions in the semiconductor pillar. The material of the bit line may be metal, such as tantalum, tungsten, At least one of titanium, tantalum, copper, aluminum, silver, gold. Herein, the deposition process may be an atomic layer deposition process.

With reference to FIG. 8 to FIG. 23, form stair structure, stair structure comprises multi-stage step 101, and step 101 at least comprises the first part and the second part that connect, and the first part extends along the first direction X, and the second part extends along the second directions Y, and the first direction X is different from the second direction Y. The step 101 of the previous level is located on part of the top surface of the current step 101. Specifically, it means that the multi-level steps 101 are stacked up and down along the same direction.

A plurality of electrical contact structures are formed, the electrical contact structures cover part of the top surfaces of the steps 101 of the first part and the second part, and the electrical contact structures are in contact with the word line 11 or the bit line 12. The step 101 can be used as the bearing structure of the electrical contact structure. When the electrical contact structure is located on the top surface of the step 101 of the first part and the second part, the electrical contact structure also extends toward the first direction X or the second direction Y, so that the electrical contact of the structure also extends in two different directions. It is equivalent to forming at least two sets of steps in the ladder structure 1, so that the word line 11 or the bit line 12 can contact the electrical contact structure in the first direction X or the second direction Y, so as to realize signal transmission with external circuits. That is to say, by setting the steps 101 to extend in different directions, the electrical contact structures can be led out in different directions, thereby increasing the ways of leading out the leads and reducing the difficulty of arranging the leads.

In some embodiments, the electrical contact structure exposes part of the top surface of the step 101, further comprising: forming an isolation structure 104 on the surface of the step 101 where the top surface is exposed, and the isolation structure 104 is located between adjacent electrical contact structures. The step 101 also acts as a bearing for the isolation structure 104, and the isolation structure 104 is located on one side of the electrical contact structure, so that the isolation structure 104 can better isolate the electrical contact structure.

Figure 10:
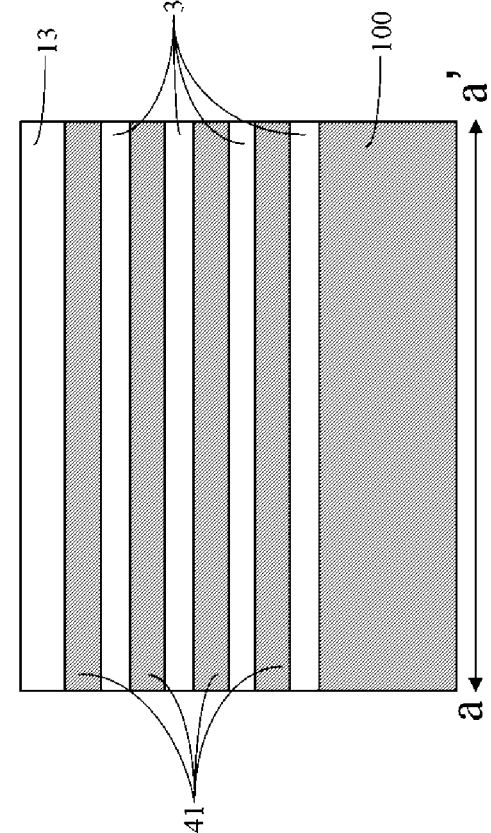
Figure 11:
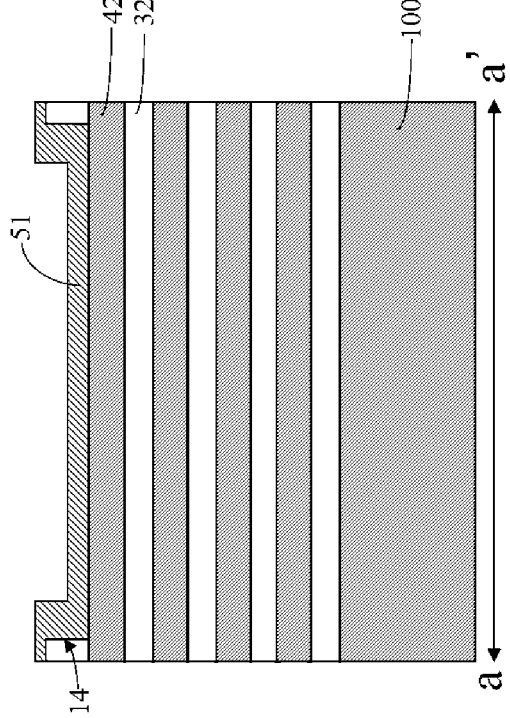

Specifically, in some embodiments, the method for forming ladder structure 1 and electrical contact structure comprises:

Referring to FIG. 11 to FIG. 10, substrate 100 is provided: on substrate 100, form isolation layer 31 and initial contact layer 41 stacked in sequence, with the isolation layer 31 of top layer as first layer isolation layer 31, the initial contact layer of top layer 41 serves as the first initial contact layer 41, the bottom isolation layer 31 serves as the Nth isolation layer 31, and the bottom initial contact layer 41 serves as the Nth initial contact layer 41. Wherein, the isolation layer 31 and the initial contact layer 41 are arranged at intervals, and each layer of isolation layer 31 is used as a basis for forming the step 101, and each initial contact layer 41 can be used as a support layer to support the isolation layer 31. In addition, the initial contact layer 41 can also be used as a basis for a subsequently formed contact layer.

In some embodiments, the material of the substrate 100 is silicon. In some other embodiments, the substrate 100 may also be a germanium substrate 100, a silicon germanium substrate, a silicon carbide substrate or a silicon-on-insulator substrate.

In some embodiments, when the substrate 100 is a silicon substrate and the material of the initial contact layer 41 is silicon, the method for forming the isolation layer 31 and the initial contact layer 41 stacked in sequence may include:

The first sacrificial layer and the initial contact layer 41 are sequentially formed on the substrate 100 by an epitaxial process, and the first sacrificial layer and the initial contact layer 41 are arranged at intervals. In some embodiments, the material of the first sacrificial layer may be silicon germanium, so that the first sacrificial layer, the initial contact layer 41 and the substrate 100 have the same element silicon, so that the substrate 100 can be formed more easily by epitaxial process. The first sacrificial layer and the initial contact layer 41 are sequentially formed on the top surface, and the formed first sacrificial layer and the initial contact layer 41 have a clear boundary and have a relatively flat shape. After the first sacrificial layer is subsequently removed, on the one hand, the initial contact layer 41 has a flat topography, on the other hand, so that the first sacrificial layer can be removed relatively cleanly.

Next, the first sacrificial layer is removed to form a gap layer, and the gap layer exposes the surfaces of two adjacent initial contact layers 41. In some embodiments, any one of a dry etching process or a wet etching process may be used to remove the first sacrificial layer.

An isolation layer 31 is formed in the gap layer, and the formed isolation layer 31 is located between the two initial contact layers 41 and is in contact with the initial contact layer 41. In some embodiments, the material of the isolation layer 31 may be a dielectric material, such as silicon oxide. The hardness of silicon oxide is relatively high, so that the formed step 101 has a better bearing effect on the electrical contact structure 102. In some embodiments, a deposition process may be used to form the isolation layer 31 in the gap layer, and the deposition process may be any one of atomic layer deposition or thermal oxidation process.

Referring to FIG. 11 to FIG. 23, first process is carried out to the first isolation layer 31 and the first initial contact layer 41 to the Nth isolation layer 31 and the N initial contact layer 41 successively, wherein, to the first n-layer isolation layer 31 and the n-th initial contact layer 41 are subjected to the first process to form the n-level step 101 and the electrical contact structure 102 and the isolation structure 104 corresponding to the n-level step 101, 1≤n≤N. Assuming that the n-th layer of isolation layer 31 and the n-th layer of initial contact layer 41 are used as a group of initial structures, the same first process is sequentially performed on each group of initial structures to form steps 101 corresponding to the number of layers in each group and An electrical contact structure 102 and an isolation structure 104 corresponding to the step 101. In this way, there is no need to etch the stacked multi-layer isolation layer 31 and the initial contact layer 41 in one step. Since each first process only targets one layer of initial contact layer 41 and one layer of isolation layer 31, in each first process step, the aspect ratio of the hole formed by etching is small, which is beneficial to improve the semiconductor structure formed. yield rate.

Figure 5:
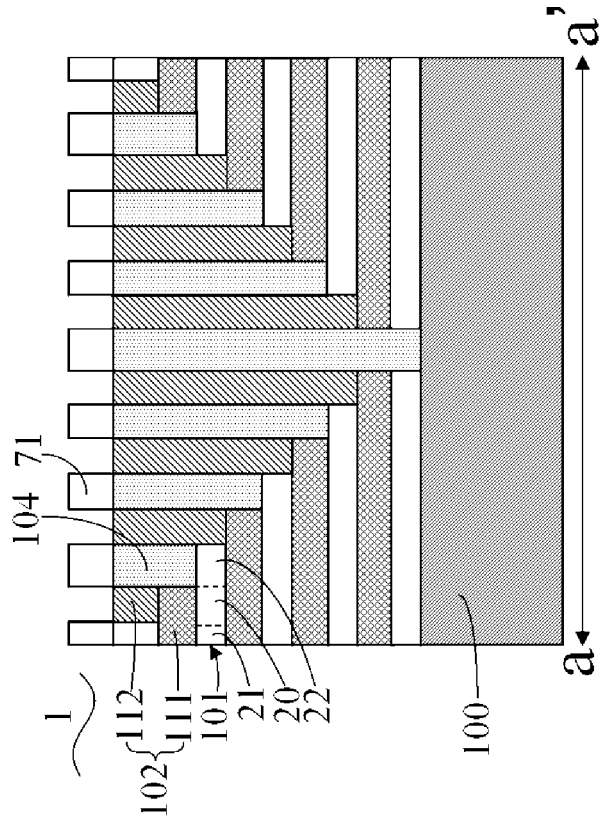
FIG. 5 is a cross sectional structure along line aa' in FIG. 4.

Specifically, referring to FIG. 5, in some embodiments, the formed electrical contact structure 102 includes: a contact layer 111, the contact layer 111 covers the top surface of the step 101, and the upper step 101 is exposed at the current step 101. Part of the top surface of the contact layer 111 top surface; connecting pillars 112, the connecting pillars 112 are in contact with the exposed top surface part of the contact layer 111, and the connecting pillars 112 are perpendicular to the contact layer 111, wherein each step 101 corresponds to the connecting pillar 112. The top surfaces are flush, and the ladder structure 1 exposes the end surface of the contact layer 111 away from the connection column 112, and the exposed end surface is in contact with one of the bit line 12 or the word line 11. One end of the contact layer 111 is in contact with the word line 11 or the bit line 12, so that the contact layer 111 is electrically connected with the word line 11 or the bit line 12, and the other end of the contact layer 111 is in contact with the connection column 112, and the contact layer 111 is connected to the contact layer 111 through the connection column 112. The electrical signal is drawn out, so as to realize the signal transmission between the word line 11 or the bit line 12 and the external circuit.

With reference to FIG. 11 to FIG. 23, in some embodiments, the step 101 that forms surrounds a closed ring, and the first process includes:

A connecting pillar 112 is formed on apart of the top surface of the n-th initial contact layer 41, the connecting pillar 112 forms a closed ring, and the connecting pillar 112 exposes part of the top surface of the n-th initial contact layer 41. The top surface of the n-th initial contact layer 41 that exposes the top surface is also in a closed ring shape, so that the shapes of the first groove and the second groove formed subsequently are correspondingly closed ring shapes, so that the formed step 101 And the shape of the electrical contact structure 102 corresponding to the step 101 is ring-shaped.

Carry out etching process to the n-th initial contact layer 41 that exposes the top surface, form the first groove 14, the first groove exposes part of the n-th layer isolation layer 31 top surface, on the first groove sidewall and the sidewalls of the connection columns 112 form the isolation structure 104, and the isolation structure 104 is also located on the top surface of part of the n-th isolation layer 31, wherein the top surface of the formed isolation structure 104 is flush with the top surface of the connection column 112. Specifically, the sidewall of the first groove is the initial contact layer 41, and the sidewall of the formed first groove is flush with the sidewall of the connecting post 112, so that the subsequent formation of the connecting post 112 and the sidewall of the first groove isolation structure 104 can be in close contact with the connection column 112 and the initial contact layer 41, so that the isolation structure 104 can better isolate and protect the connection column 112 and the isolation structure 104. Moreover, the top surface of each isolation structure 104 is set to be flush with the top surface of the connection column 112, and the isolation structure 104 can completely cover the sidewall of the connection column 112, thereby isolating the connection column 112. It is worth noting that the connection column 112 formed by performing the first process on the n+1th initial contact layer 41 and the n+1th isolation layer 31 is the same as the process performed on the n+1th initial contact layer 41 and the n-th isolation layer 31. The top surfaces of the isolation structures 104 formed in the first process are flush, so that after the first process is repeated, the top surfaces of the formed plurality of connecting columns 112 and the plurality of isolation structures 104 are all flush, so that the better isolation structures 104 can be realized.

Carry out etching process to the n-th isolation layer 31 that exposes the top surface, form the second groove, the second groove exposes the n+1th initial contact layer 41, and the remaining n-th isolation layer 31 forms the n-th level in the steps 101. Since the formed connection columns 112 and the isolation structure 104 are located on the top surface of the step 101, and the first process proceeds from the first layer to the Nth layer, that is, starting from the top layer, therefore, in the actual manufacturing process, the connection columns 112 and the isolation structure 104 are subsequently formed with steps 101.

The n-th isolation layer 31 exposed on the top surface referred to as top surface of the n-th isolation layer 31 not covered by the isolation structure 104, and the second groove exposes the n+1th initial contact layer 41. In this way, in the (n+1)-th first process, the connection columns 112 can be formed on the exposed top surface of the (n+1)-th layer.

The side wall of the second groove formed is the isolation layer 31, and the side wall of the second groove is flush with the side wall of the isolation structure 104, so that when the connecting column 112 corresponding to the (n+1)-th step 101 on the sidewall of the second groove, the formed connecting column 112 can be in close contact with the isolation structure 104.

In some embodiments, the projection shapes of the first groove and the second groove on the surface of the substrate 100 are both rectangular. In this way, the shape of the formed steps 101, the contact layer 111 and the connection post 112 corresponding to each step 101 is a closed rectangle. That is to say, a ladder structure 1 is equivalent to including four sets of ladders. When the electrical contact structure 102 is connected to any one of the word line 11 or the bit line 12, the lead-out structure 103 can be set to be respectively connected to the electrical contacts located in different directions. The structures 102 are connected. The lead-out structures 103 can be fully utilized to design the lead-out structures 103, and while preventing electrical interference between different lead-out structures 103, the difficulty of arranging the lead-out structures 103 is greatly reduced. Moreover, since the lead-out structures 103 are located in different orientations, the distance between the lead-out structures 103 is greatly increased, thereby greatly improving the defect of large parasitic capacitance due to the dense arrangement of the lead-out structures 103.

Specifically, the first process will be described below by taking N as 4, that is, taking the formation of 4 steps 101 as an example.

Figure 12:
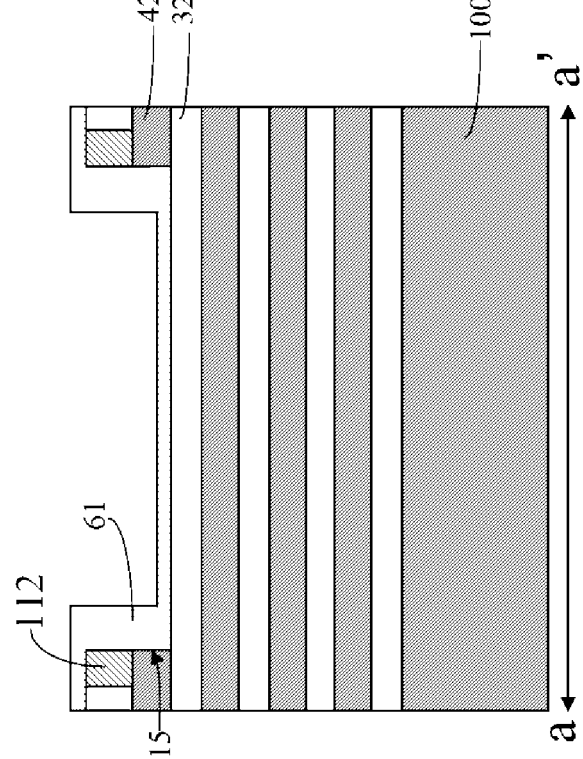

The first process is performed for the first time, referring to FIG. 11 and FIG. 12, and the connection column 112 is formed on the top surface of the first initial contact layer 42. Referring to FIG. 10, in some embodiments, a mask layer 13 can be formed on the top surface of the initial contact layer 41 of the top layer. The mask layer 13 plays a patterning role on the one hand, and on the other hand also plays a role in supporting the formed connecting pillars 112. The supporting function prevents the connecting column 112 of the first floor from collapsing due to lack of side support.

In some embodiments, the material of the mask layer 13 can be silicon oxide, specifically, the mask layer 13 can be formed on the top surface of the first initial contact layer 42 by using an atomic layer deposition process or a thermal oxidation process.

Patterning the mask layer 13, in some embodiments, self-aligned multiple exposure technology (SAQP, Self-Aligned Quadruple Patterning) or self-aligned multiple imaging technology (SADP, Self-aligned Double Patterning) to perform an etching process; perform an etching process on the patterned mask layer 13 to form an initial groove, the sidewall of the initial groove exposes the remaining part of the mask layer 13, and the top of the initial groove exposes part of the initial contact of the first layer layer 42 top surface; form the first layer of initial connection layer 51 on the initial groove sidewall and the first layer of initial contact layer 42 top surface; remove part of the first layer of initial connection layer 51 located at the initial groove sidewall, and remove part of the first initial connection layer 51 located on the top surface of the first initial contact layer 42 to form a connection column 112 with a preset thickness, the formed connection column 112 is a closed ring, and part of the top of the first initial contact layer 42 is exposed noodle.

Referring to FIG. 12, the first initial contact layer 42 exposed on the top surface is etched to form a first groove 14, the sidewall of the first groove 14 is flush with the sidewall of the connecting column 112, and the sidewall of the first groove 14 exposes the first initial contact layer 42, and the bottom of the first groove 14 exposes the first isolation layer 31.

The first initial isolation structure 61 is formed on the sidewall of the first groove, the sidewall of the connecting column 112, and the top surface of the first layer isolation layer 32 by a deposition process, and the first initial isolation structure 61 is also located on the top surface of the mask layer And the top surface of the connecting column 112.

Figure 13:
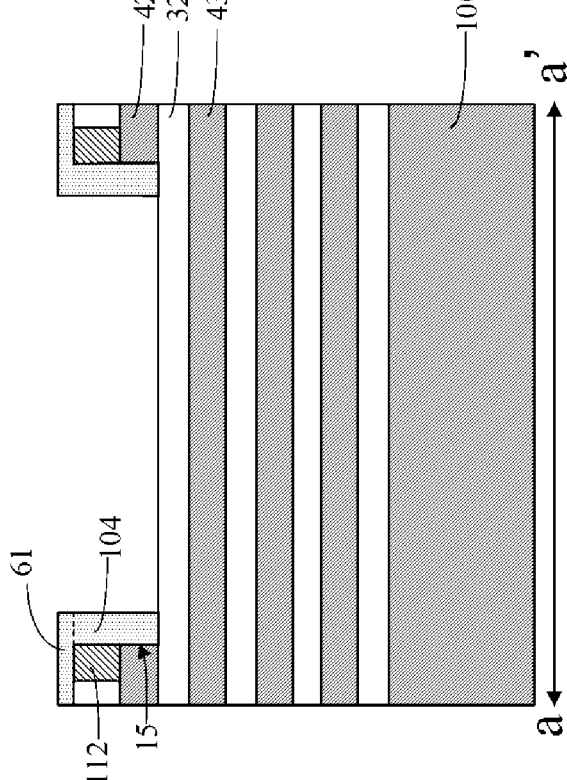

Referring to FIG. 13, part of the first initial isolation structure 61 located on the sidewall of the first groove 14 (refer to FIG. 12) is removed, and part of the first initial isolation structure 61 located on the top surface of the first isolation layer 32 is removed, In order to form the isolation structure 104 with a predetermined thickness, and expose part of the top surface of the first isolation layer 32. It should be noted that the first initial isolation structure 61 located on the top surface of the mask layer and the top surface of the connection column 112 may not be removed, and is used as a mask for the second initial connection layer formed later.

Carry out etching process to the first layer isolation layer 32 that exposes the top surface, form the second groove 15, the side wall of the second groove 15 exposes the first layer isolation layer 32, leaving part of remaining first isolation layer 32 as the first step 101. The bottom of the second groove 15 exposes part of the top surface of the second initial contact layer 43, and the sidewall of the second groove 15 is flush with the sidewall of the isolation structure 104.

Figure 14:
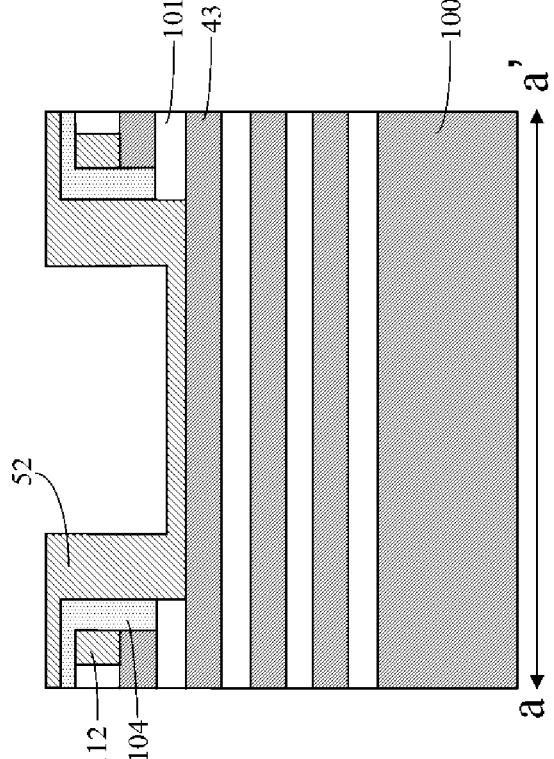

Carry out the first process for the second time, with reference to FIG. 14, form the second initial connection layer 52 on the sidewall of the second groove, the sidewall of the isolation layer 31 and the top surface of the second initial contact layer 43, it can be understood that, because in the first process, the first initial isolation structure 61 located on the top surface of the mask layer and the top surface of the connection column 112 is not removed, therefore, the second initial connection layer 52 is also located on the top surface of the first initial isolation structure 61 (refer to FIG. 13). The isolation of the connection layer 52 facilitates subsequent removal of the second initial connection layer 52 on the top surface of the first initial isolation structure 61 (refer to FIG. 13) without causing process damage to the connection column 112 formed in the first process.

Removing part of the second initial connection layer 52 located at the sidewall of the second groove and the sidewall of the isolation structure 104, and removing part of the second initial connection layer 52 located at the top surface of the second initial contact layer 43 and the second initial connection layer 52 located at the top surface of the second initial contact layer 43. The second initial connection layer 52 on the top surface of the initial isolation structure 61 is used to form the connection column 112 with a predetermined thickness, and part of the top surface of the second initial contact layer 43 is exposed.

Figure 15:
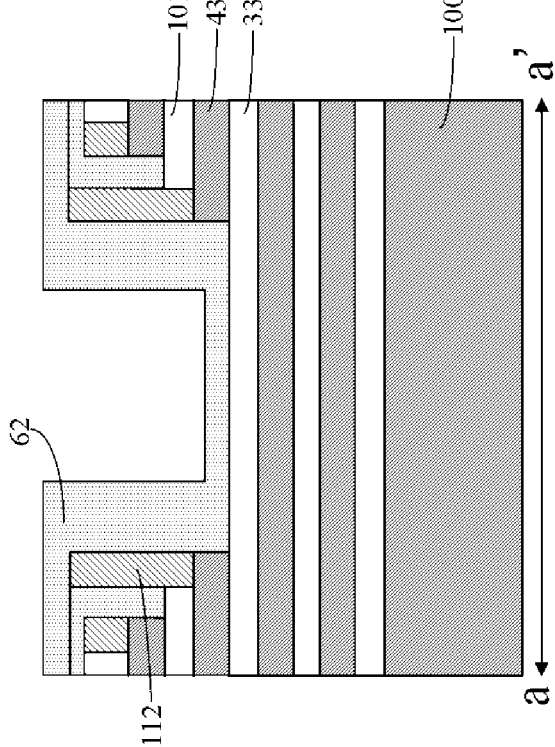

Referring to FIG. 15, an etching process is performed on the second initial contact layer 43 exposed on the top surface to form a first groove, and a second initial isolation structure 62 is formed in the first groove.

Figure 16:
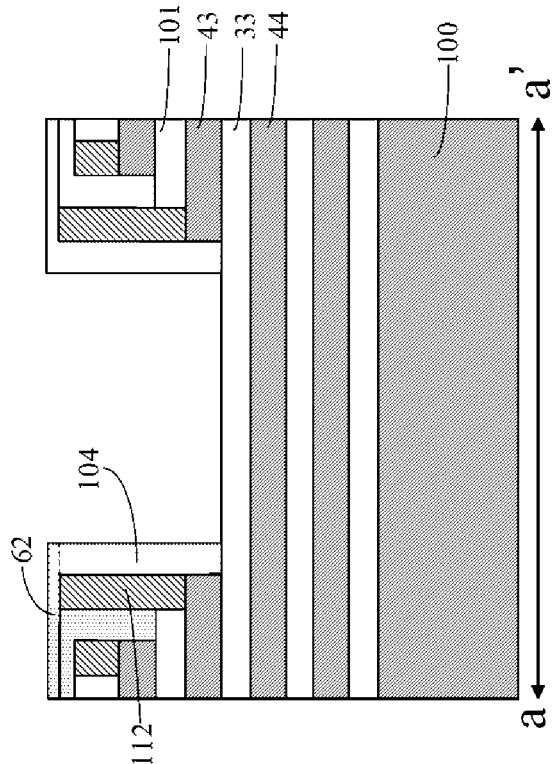

Referring to FIG. 16, an etching process is performed on the second initial isolation structure 62 to form an isolation structure 104 corresponding to the second-level step 101. Herein, the method of performing the etching process on the second initial isolation structure 62 is the same as the method of performing the etching process on the first initial isolation structure 61 in the first process. It should be noted that the second initial isolation structure 62 located on the top surface of the connection column 112, so the top surface of the isolation structure 104 corresponding to the first step 101 may not be removed.

The second isolation layer 33 exposed on the top surface is etched to form a second groove, the sidewall of the second groove exposes the second isolation layer 33, leaving part of the second isolation layer 33 as the second steps 101. The bottom of the second groove exposes part of the top surface of the third initial contact layer 44, and the sidewall of the second groove is flush with the sidewall of the isolation structure 104.

Carry out the first process for the third time and the fourth time, it can be appreciated that the first process for the third time and the fourth time is the same as the first process in the previous two times, they will only be briefly described below, the specific description may refer to the above mentioning of the first process.

Figure 17:
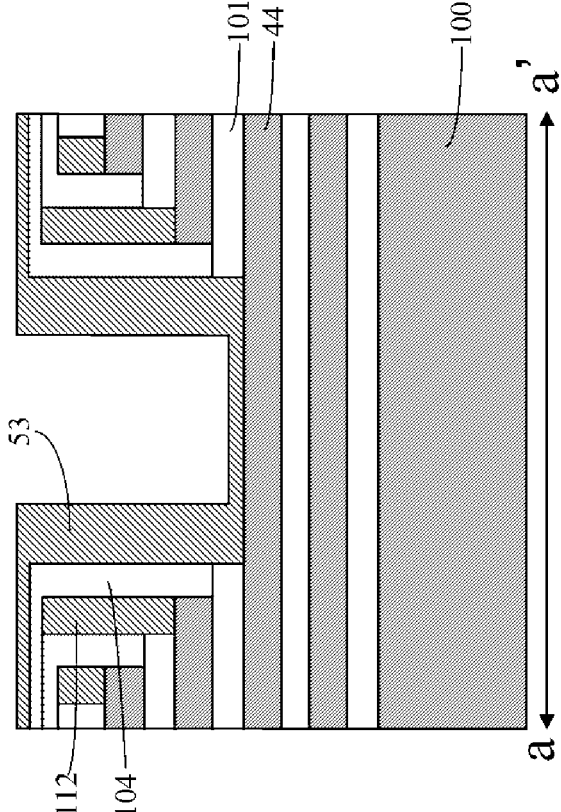

The third time first process is performed, referring to FIG. 17, to form a third initial connection layer 53.

Figure 18:
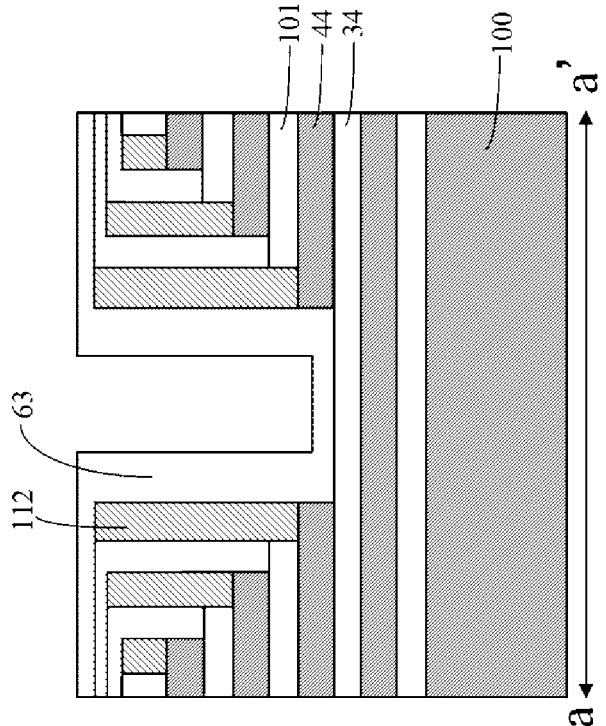

Referring to FIG. 18, an etching process is performed on the third initial connection layer 53 to form connection columns 112.

The third initial contact layer 44 is etched to form a first groove, and a third initial isolation structure 34 is formed on the sidewall of the first groove, the sidewall of the connecting column 112 and the top surface of the third isolation layer 63.

Figure 19:
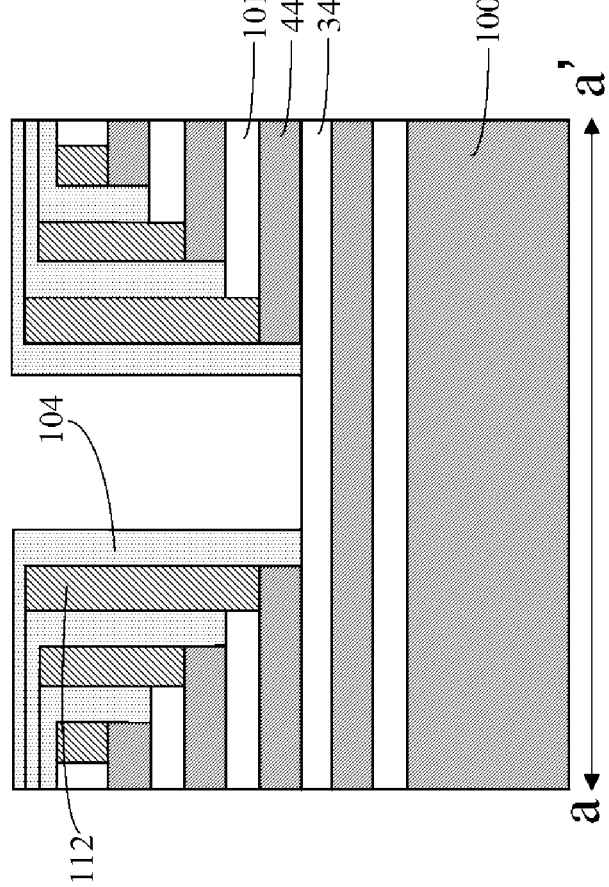

Referring to FIG. 19, an etching process is performed on the third initial isolation structure 63 to form an isolation structure 104.

Etching the third isolation layer 34 exposed from the top surface to form a second groove, the sidewall of the second groove exposes the third isolation layer 34, and the remaining part of the third isolation layer 34 is used as a third step 101. The bottom of the second groove exposes part of the top surface of the fourth initial contact layer 41, and the sidewall of the second groove is flush with the sidewall of the isolation structure 104.

Figure 20:
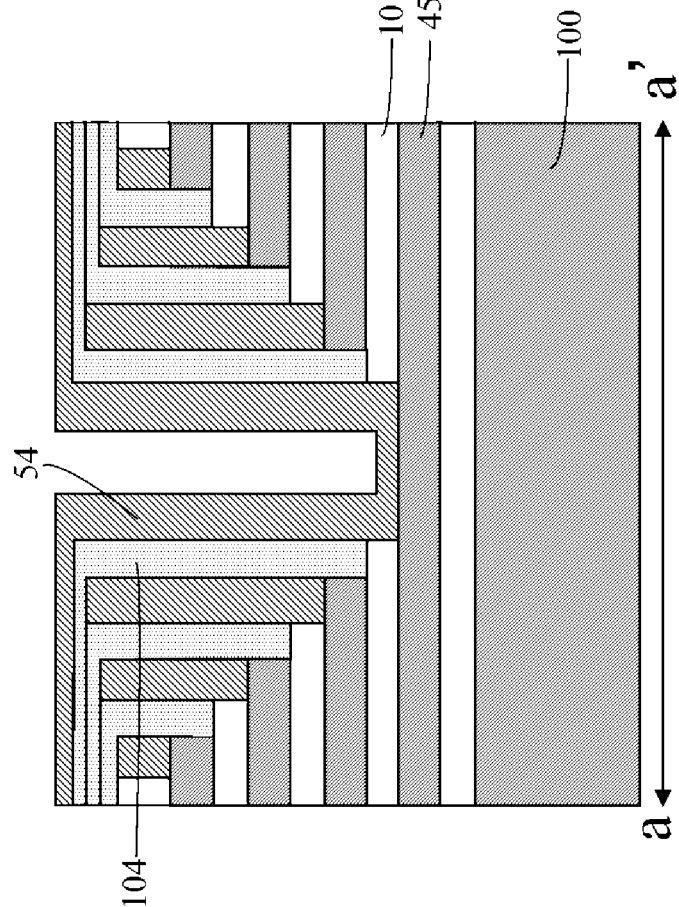

The fourth time first process is performed, referring to FIG. 20, to form a fourth initial connection layer.

Figure 21:
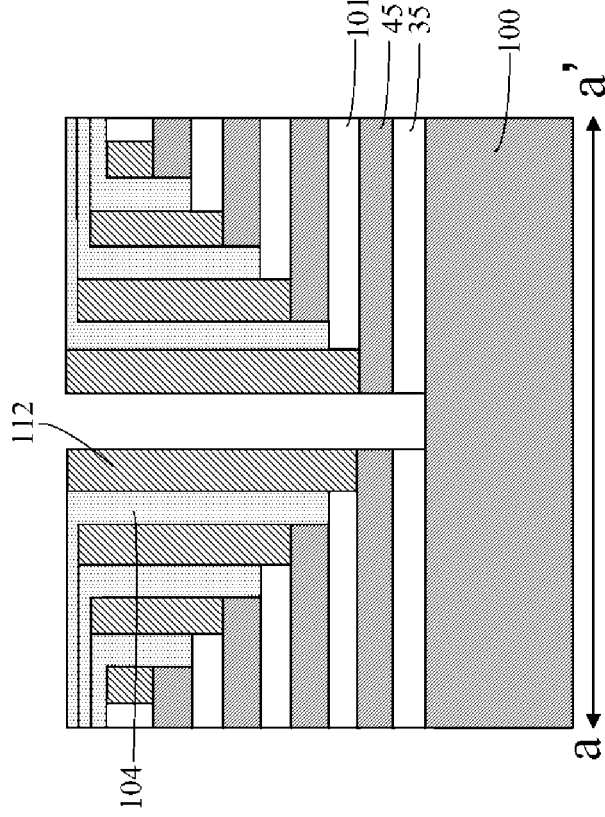

Referring to FIG. 21, an etching process is performed on the fourth initial connection layer to form connection columns 112.

Carry out etching process to the fourth initial contact layer 45, form the first groove, it can be understood that, because the fourth initial contact layer 45 is the last initial contact layer, therefore, after forming the connecting column 112, the top surface of the fourth isolation layer 35 exposed by the first groove may be directly etched until a part of the top surface of the substrate 100 is exposed.

Figure 22:
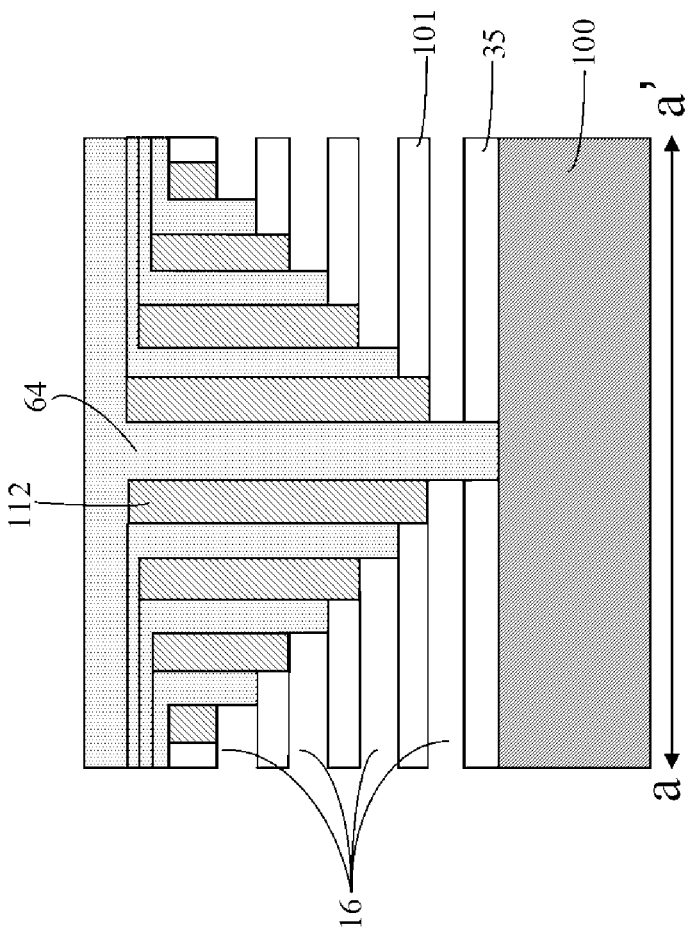

Referring to FIG. 22, then, a fourth initial isolation structure 64 is formed on the sidewall of the first groove, the sidewall of the connecting column 112, the sidewall of the fourth isolation layer 35, and the top surface of the substrate 100. The fourth initial isolation structure 64 fills the gaps between the gaps between the closed rings formed by the connecting posts 112, the first groove and the gaps between the closed rings formed by the fourth isolation layer 35. Moreover, the fourth initial isolation structure 64 is also located on the top surface of the connection columns 112 and the isolation structure formed in the previous first process.

Figure 23:
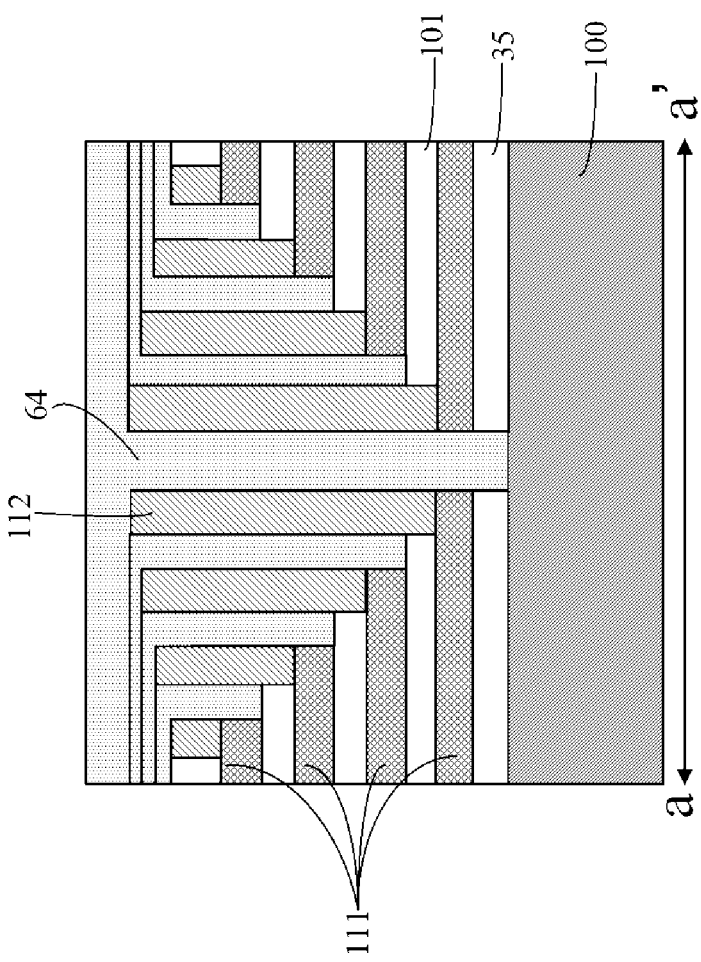

Referring to FIG. 23, the remaining part of the initial contact layer 41 (refer to FIG. 10) is removed to form a contact layer 111, and the contact layer 111 is connected to the connecting column 112 to form an electrical contact structure together. The rest of the initial contact layer here refers to the initial contact layer that has not been removed by etching in the first process. From the aforementioned steps of forming the isolation structures 104 and the connection columns 112, each formed connection column 112 is located on a portion of the top surface of the initial contact layer, and each formed isolation structure 104 is in contact with the remaining portion of the sidewall of the initial contact layer. Therefore, after the remaining part of the initial contact layer is removed, and the contact layer 111 is formed at the position of the original remaining part of the initial contact layer 41, each connecting column 112 formed is located on the top surface of the part of the contact layer 111, and each isolation structure 104 is formed with the sidewalls of the contact layer 111 are in contact, so that the connecting column 112 can lead out the electrical signal of the contact layer 111, and the isolation structure 104 can isolate the adjacent contact layer 111.

In some embodiments, the method for forming the contact layer 111 includes:

Referring to FIG. 22, the initial contact layer is removed to form a third groove 16; in some embodiments, a wet etching process or a dry etching process can be used to remove the initial contact layer, and the third groove exposes the previous bottom surface of the step 101 of the first step and the top surface of the step 101 of the current level.

The contact layer 111 is formed in the third groove 16 using a deposition process. In some embodiments, the contact layer 111 may be metal, such as at least one of tantalum, tungsten, titanium, copper, aluminum, silver, and gold. The deposition process may be an atomic layer deposition process. Metal has good electrical conductivity, and the use of metal to connect the bit line 12 or the word line 11 can speed up the signal transmission speed of the contact layer 111.

In some other embodiments, the material of initial contact layer is silicon, and the method for forming contact layer 111 comprises:

A doping process is performed on the initial contact layer, and the initial contact layer is doped with dopant ions, so as to convert the initial contact layer into a contact layer 111. That is to say, it is not necessary to use an etching process to etch the initial contact layer, so that the etching step can be omitted.

Specifically, in some embodiments, the material of the initial contact layer may be a silicon-based material, such as polysilicon or silicon, and the dopant ions may be any of N-type ions or P-type ions. The doping process may be any one of ion implantation or thermal diffusion.

Referring to FIG. 5, after forming the contact layer 111, it further includes: planarizing the fourth initial isolation structure 64 (refer to FIG. 22) located on the top surface of the connection column 112 and the isolation structure 104, so as to remove the four initial isolation structures. The structure 104 (refer to FIG. 21), exposing the top surface of each connecting column 112.

A second sacrificial layer is formed on the top surface of the connection column 112 and the top surface of the isolation structure 104 by a deposition process, and the material of the second sacrificial layer may be silicon nitride.

performing a patterning process on the second sacrificial layer; performing an etching process on the patterned second sacrificial layer, retaining the second sacrificial layer 71 located on the top surface of the isolation structure 104, and forming a plurality of first sacrificial layers with the remaining second sacrificial layer through holes, wherein each through hole exposes the top surface of the connecting post 112.

Form lead-out structure 103 (referring to FIG. 4) in the second through hole, each lead-out structure 103 is contacted with connecting column 112 top surface, can set lead-out structure 103 to be connected with connecting column 112 on different directions, in realizing In the case of signal transmission between the word line 11 or the bit line 12 and the external circuit, the flexibility of setting the lead-out structure 103 is greatly improved, thereby reducing the difficulty of arranging the lead-out structure 103. Moreover, since the lead-out structures 103 can be arranged from different directions, the distance between the lead-out structures 103 is relatively large, thereby reducing parasitic capacitance. In some embodiments, the material of the extraction structure 103 may be metal, such as at least one of tantalum, tungsten, titanium, copper, aluminum, silver, and gold.

In some embodiments, also include:

Perform a patterning process on the top surface of the ladder structure 1, specifically, perform a patterning process on the top surface of the connecting column 112 and the top surface of the isolation structure 104 to define subsequent etching openings.

Etching the patterned ladder structure 1 until the substrate 100 is cut through to form two sub-ladder structures 2, the step 101 in the sub-ladder structure 2 includes a first part and a second part. In some embodiments, when forming the ladder structure 1, each step 101, each electrical contact structure 102, and each isolation structure 104 is a closed ring, so that in a step of the first process, the Forming the ladder structure 1 in different directions is equivalent to forming multiple sets of ladders, thus greatly improving the preparation efficiency.

Based on forming the ladder structure 1 with a closed ring structure, the ladder structure 1 is subjected to an etching process, and the ladder structure 1 is divided into two, or one is divided into many, so that each formed In the sub-ladder structure 2, each step 101 only includes: a first part and a second part that are connected, the first part and the second part extend in different directions, and also include an electrical contact structure 102 corresponding to the first part and the second part or, in some other embodiments, each step 101 may also include a connected first part, a second part and a third part, and also include an electrical contact structure corresponding to the first part, the second part and the third part 102; or, the step 101 may further include a fourth part, and the electrical contact structure 102 is also located on the top surface of the step 101 of the fourth part. That is to say, the ladder structure 1 can be etched based on the available space of the semiconductor structure and the arrangement of the word lines 11 and the bit lines 12, so that the shape of the sub-step structure 2 can meet the requirements, and the step structure can be greatly improved.

Figure 24:
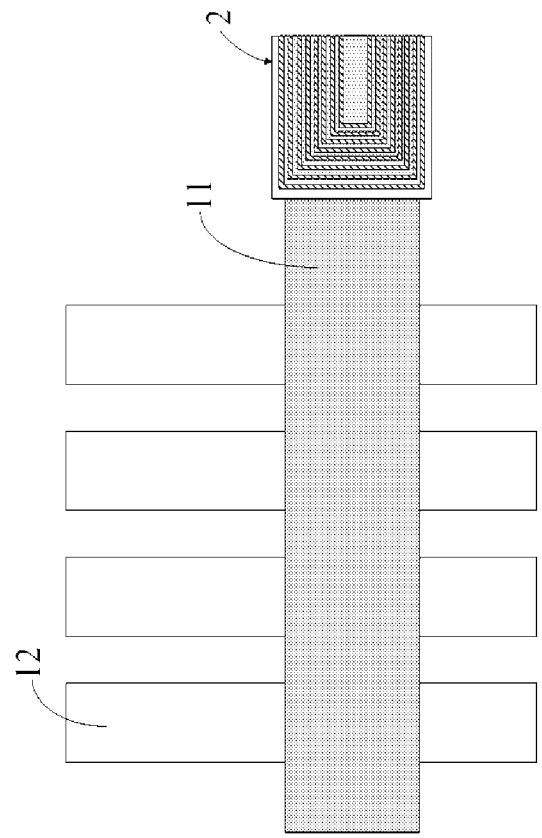
FIG. 24 is a schematic structural diagram of the sub-ladder structure formed in the method for preparing a semiconductor structure provided by another embodiment of the present disclosure.
Figure 25:
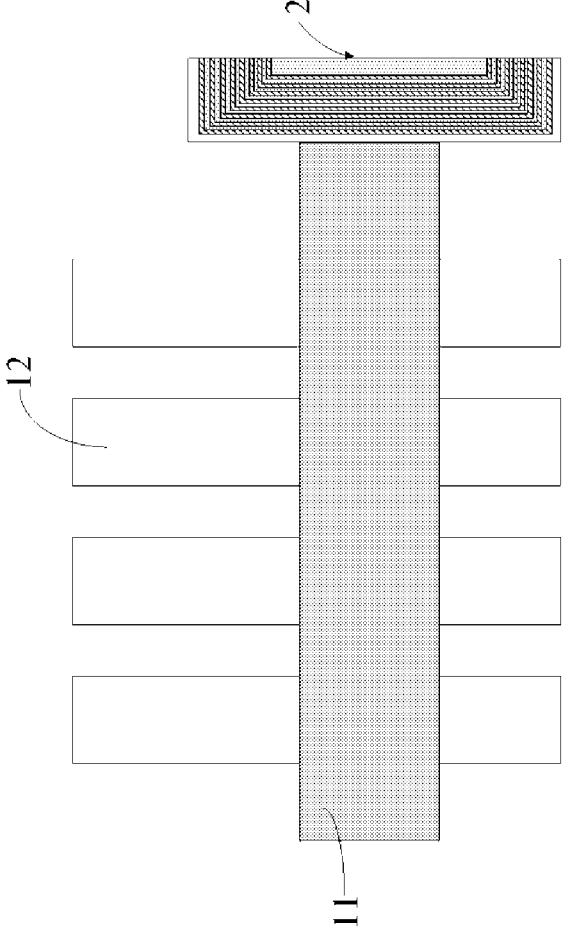
FIG. 25 is a schematic diagram of another sub-ladder structure formed in the method for preparing a semiconductor structure provided by another embodiment of the present disclosure.

Specifically, referring to FIG. 24 and FIG. 25, in some embodiments, etching can be carried out along the midline of the top surface of the ladder structure 1 in different directions, and the ladder structure 1 has been divided into two to form two sub-structures. In the ladder structure 2, in the two sub-ladder structures 2 thus formed, each step 101 forms a U-shape, and the electrical contact structure 102 and the isolation structure 104 also correspond to the shape of the step 101.

Figure 26:
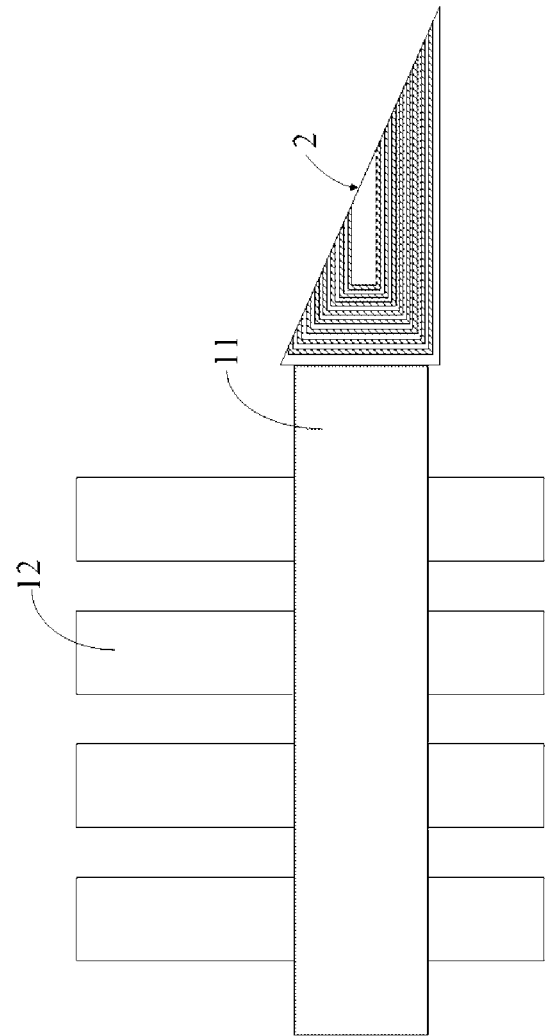
FIG. 26 is another structural schematic diagram of the sub-ladder structure formed in the method for manufacturing a semiconductor structure provided by another embodiment of the present disclosure.

In some other embodiments, referring to FIG. 26, it is also possible to etch along the diagonal line of the top surface of the ladder structure 1, and in the two sub-ladder structures 2 formed, some steps 101 only include the first part and the second part. The steps 101 also include a third part connected to the second part, the extension direction of the third part is different from that of the second part, and the electrical contact structure 102 and the isolation structure 104 are also in the same shape as the step 101.

In the manufacturing method of the semiconductor structure provided in the above embodiment, the formed electrical contact structure 102 is located on the top surface of the step 101 of the first part and the second part, so that the electrical contact structure 102 also extends in two different directions. It is equivalent to forming at least two sets of steps in the ladder structure 1, so that the word line 11 or the bit line 12 can contact the electrical contact structure 102 in the first direction X or the second direction Y, so as to realize signal transmission with external circuits. That is to say, by setting the steps 101 to extend in different directions, the electrical contact structure 102 can be led out in different directions, thereby increasing the distribution of leading out the leads and reducing the difficulty of arranging the leads.

Those of ordinary skill in the art can understand that the above-mentioned implementations are specific examples for realizing the disclosure, and in practical applications, various changes can be made to it in form and details without departing from the disclosure spirit and scope. Any person skilled in the art can make respective alterations and modifications without departing from the spirit and scope of the present disclosure. Therefore, the protection scope of the present disclosure should be determined by the scope defined in the claims.

The invention claimed is:

1. A semiconductor structure, comprising:

a plurality of word lines (11) and a plurality of bit lines (12), wherein the plurality of word lines (11) extends in a direction which is different from a direction the plurality of bit lines (12) extends;

a ladder structure (1), wherein the ladder structure (1) comprises multiple steps (101), wherein the steps (101) comprise a first part (121) and a second part (122) that are connected, wherein the first part extends in a first direction (X), the second part (122) extends in a second direction (Y), and the first direction (X) is different from the second direction (Y); and a plurality of electrical contact structures (102), wherein the plurality of electrical contact structures (102) is disposed on top surfaces of a portion of the first part (121) and the second part (122) of the steps (101), and wherein the plurality of electrical contact structures (102) is in contact with the plurality of word lines (11) or the plurality of bit lines (12).

2. The semiconductor structure according to claim 1, wherein a portion of the steps (101) further comprises: a third part (123) connected to the second part (122), wherein the third part (123) extends along a third direction (W), wherein the third direction (W) is different from the second direction (Y), and wherein the plurality of electrical contact structures (102) is also disposed on top surfaces of the third part (123) of a portion of the steps (101).

3. The semiconductor structure according to claim 2, wherein the third direction (W) is parallel to the first direction (X).

4. The semiconductor structure according claim 1, wherein each of the steps (101) comprises a third part (123), a first part (121), a second part (122), and wherein the first part (121) and the second part (122) connect to the third part (123) sequentially to make steps (101) form U-shapes.

5. The semiconductor structure according to claim 1, wherein the steps (101) form a closed ring.

6. The semiconductor structure according to claim 5, wherein the closed ring is a closed rectangle, wherein the steps (101) comprise: a first part (121), a second part (122), a third part (123), and a fourth part (124),) connected in sequence, and wherein the third part (123) extends along the first direction (X), the fourth part (124) extends along the second direction (Y), and wherein the plurality of electrical contact structure (102) is disposed on top surfaces of the third part (123) and the fourth part (124) of the steps (101).

7. The semiconductor structure according to claim 1, 2 or 5, wherein the plurality of electrical contact structures (102) comprises:

a contact layer (111), where the contact layer (111) is disposed on top surfaces of a portion of the steps (101);

a connecting column (112), wherein the connecting column (112) is in contact with the contact layer (111), wherein a top surface of the connecting column (112) is configured to be flush with the top surfaces of the plurality of steps (101), and wherein the ladder structure (1) exposes end surfaces of the contact layer (111) away from the connection column (112), wherein the exposed end surfaces are in contact with one of the plurality of bit lines (12) or the plurality of word lines (11).

8. The semiconductor structure according to claim 7, further comprising: a plurality of lead-out structures (103), wherein the lead-out structures (103) are electrically connected to the top surface of the connection column (112).

9. The semiconductor structure according to claim 1, further comprising: an isolation structure (104), wherein the isolation structure (104) is located between two adjacent ones of the plurality of electrical contact structures (102), and wherein the isolation structure (104) isolates two adjacent ones of the plurality of electrical contact structures (102).

10. The semiconductor structure according to claim 1, wherein the plurality of bit lines (12) or the plurality of word lines (11) is electrically connected to one of the plurality of electrical contact structures (102) corresponding to the first part (121) or the second part (122).

* * * * *